United States Patent
Ekkizogloy et al.

(10) Patent No.: US 7,447,438 B2
(45) Date of Patent: Nov. 4, 2008

(54) CALIBRATION OF DIGITAL DIAGNOSTICS INFORMATION IN AN OPTICAL TRANSCEIVER PRIOR TO REPORTING TO HOST

(75) Inventors: Luke M. Ekkizogloy, San Jose, CA (US); Jayne C. Hahin, Cupertino, CA (US); Gerald L. Dybsetter, Scotts Valley, CA (US); Stephen Nelson, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 479 days.

(21) Appl. No.: 11/118,991

(22) Filed: Apr. 29, 2005

(65) Prior Publication Data
US 2006/0002712 A1    Jan. 5, 2006

Related U.S. Application Data

(60) Provisional application No. 60/585,254, filed on Jul. 2, 2004.

(51) Int. Cl.
*H04B 10/00* (2006.01)

(52) U.S. Cl. .................. 398/135; 398/136; 398/138; 398/164

(58) Field of Classification Search ......... 398/135–138, 398/164
See application file for complete search history.

(56) References Cited

U.S. PATENT DOCUMENTS

| | | | |
|---|---|---|---|
| 4,359,553 A | 11/1982 | Edwards | |
| 4,378,451 A | 3/1983 | Edwards | |
| 4,687,924 A | 8/1987 | Galvin et al. | |
| 4,734,914 A | 3/1988 | Yoshikawa | |
| 4,747,091 A | 5/1988 | Doi | |
| 4,809,286 A | 2/1989 | Kollanyi et al. | |
| 4,916,707 A | 4/1990 | Rosenkranz | |
| 4,932,038 A | 6/1990 | Windus | |
| 5,019,769 A | 5/1991 | Levinson | |
| 5,039,194 A | 8/1991 | Block et al. | |

(Continued)

FOREIGN PATENT DOCUMENTS

EP    0580317 A1    1/1994

(Continued)

OTHER PUBLICATIONS

Yi Cai et al., "Jitter testing for gigabit serial communication transceivers," Jan.-Feb. 2002, IEEE Design and Test of Computers, vol. 19, Issue 1, pp. 66-74.

(Continued)

*Primary Examiner*—Dalzid Singh
(74) *Attorney, Agent, or Firm*—Workman Nydegger

(57) ABSTRACT

An optical transceiver configured to perform calibration of digital diagnostics prior to providing the calibrated values to a host computing system (hereinafter referred to simply as a "host") that is communicatively coupled to the optical transceiver. The optical transceiver includes a sensor that measures an analog operational parameter signal such as temperature or supply voltage. Each analog signal is then converted to digital samples by analog to digital converter(s). A processor executes microcode that causes the optical transceiver to perform calibration on the various samples to compensate for predictable error introduced into the analog signal prior to or during the analog-to-digital conversion. The optical transceiver may then make the calibrated result accessible to the host.

20 Claims, 4 Drawing Sheets

U.S. PATENT DOCUMENTS

| | | | |
|---|---|---|---|
| 5,041,491 A | 8/1991 | Turke et al. |
| 5,268,949 A | 12/1993 | Watanabe et al. |
| 5,287,375 A | 2/1994 | Fujimoto |
| 5,334,826 A | 8/1994 | Sato et al. |
| 5,383,208 A | 1/1995 | Queniat et al. |
| 5,392,273 A | 2/1995 | Masaki et al. |
| 5,396,059 A | 3/1995 | Yeates |
| 5,448,629 A | 9/1995 | Bosch et al. |
| 5,516,563 A | 5/1996 | Schumann et al. |
| 5,557,437 A | 9/1996 | Sakai et al. |
| 5,574,435 A | 11/1996 | Mochizuki |
| 5,576,877 A | 11/1996 | Aulet et al. |
| 5,594,748 A | 1/1997 | Jabr |
| 5,604,758 A | 2/1997 | AuYeung et al. |
| 5,673,282 A | 9/1997 | Wurst |
| 5,748,672 A | 5/1998 | Smith et al. |
| 5,761,216 A | 6/1998 | Sotome et al. |
| 5,801,866 A | 9/1998 | Chan et al. |
| 5,812,572 A | 9/1998 | King et al. |
| 5,854,704 A | 12/1998 | Grandpierre |
| 5,926,303 A | 7/1999 | Giebel et al. |
| 5,953,690 A | 9/1999 | Lemon et al. |
| 5,956,168 A | 9/1999 | Levinson et al. |
| 5,966,395 A | 10/1999 | Ikeda |
| 6,055,252 A | 4/2000 | Zhang |
| 6,064,501 A | 5/2000 | Roberts et al. |
| 6,157,022 A | 12/2000 | Maeda et al. |
| 6,160,647 A | 12/2000 | Gilliland et al. |
| 6,175,434 B1 | 1/2001 | Feng |
| 6,188,059 B1 | 2/2001 | Nishiyama et al. |
| 6,198,558 B1 | 3/2001 | Graves et al. |
| 6,205,505 B1 | 3/2001 | Jau et al. |
| 6,222,660 B1 | 4/2001 | Traa |
| 6,229,788 B1 | 5/2001 | Graves et al. |
| 6,256,127 B1 | 7/2001 | Taylor |
| 6,292,497 B1 | 9/2001 | Nakano |
| 6,313,459 B1 | 11/2001 | Hoffe et al. |
| 6,423,963 B1 | 7/2002 | Wu |
| 6,473,224 B2 | 10/2002 | Dugan et al. |
| 6,512,617 B1 | 1/2003 | Tanji et al. |
| 6,519,255 B1 | 2/2003 | Graves |
| 6,526,076 B2 | 2/2003 | Cham et al. |
| 6,560,255 B1 | 5/2003 | O'Brien et al. |
| 6,570,149 B2 | 5/2003 | Maruyama et al. |
| 6,594,050 B2 | 7/2003 | Jannson et al. |
| 6,631,146 B2 | 10/2003 | Pontis et al. |
| 6,643,472 B1 | 11/2003 | Sakamoto et al. |
| 6,661,836 B1 | 12/2003 | Dalal et al. |
| 6,690,693 B1 | 2/2004 | Crowder |
| 6,694,462 B1 | 2/2004 | Reiss et al. |
| 6,748,181 B2 | 6/2004 | Miki et al. |
| 6,862,302 B2 | 3/2005 | Chieng et al. |
| 6,937,949 B1 | 8/2005 | Fishman et al. |
| 6,941,077 B2 | 9/2005 | Aronson et al. |
| 6,952,531 B2 | 10/2005 | Aronson et al. |
| 7,020,567 B2 | 3/2006 | Fishman et al. |
| 7,058,310 B2 | 6/2006 | Aronson et al. |
| 2001/0046242 A1 | 11/2001 | Kawakami et al. |
| 2001/0046243 A1 | 11/2001 | Schie |
| 2002/0021468 A1 | 2/2002 | Kato et al. |
| 2002/0027688 A1* | 3/2002 | Stephenson | 359/152 |
| 2002/0060824 A1 | 5/2002 | Liou et al. |
| 2002/0097468 A1 | 7/2002 | Mecherle et al. |
| 2002/0101641 A1 | 8/2002 | Kurchuk |
| 2002/0105982 A1 | 8/2002 | Chin et al. |
| 2002/0105983 A1 | 8/2002 | Nomura |
| 2002/0122503 A1* | 9/2002 | Agazzi | 375/316 |
| 2002/0129379 A1 | 9/2002 | Levinson et al. |
| 2002/0149821 A1 | 10/2002 | Aronson et al. |
| 2002/0181519 A1 | 12/2002 | Vilhelmsson et al. |
| 2002/0181894 A1 | 12/2002 | Gilliand et al. |
| 2003/0053170 A1 | 3/2003 | Levinson et al. |
| 2003/0110509 A1 | 6/2003 | Levinson et al. |
| 2003/0113118 A1 | 6/2003 | Bartur |
| 2003/0169790 A1 | 9/2003 | Chieng et al. |
| 2003/0210917 A1 | 11/2003 | Stewart et al. |
| 2004/0022537 A1 | 2/2004 | Mecherle et al. |
| 2004/0076113 A1 | 4/2004 | Aronson et al. |
| 2004/0120720 A1 | 6/2004 | Chang et al. |
| 2004/0153913 A1 | 8/2004 | Fishman et al. |
| 2004/0202210 A1 | 10/2004 | Thornton |
| 2004/0240886 A1 | 12/2004 | Aronson et al. |
| 2004/0253003 A1 | 12/2004 | Farmer et al. |
| 2005/0031352 A1 | 2/2005 | Light et al. |
| 2005/0058455 A1 | 3/2005 | Hosking et al. |
| 2005/0249252 A1* | 11/2005 | Sanchez | 372/38.07 |
| 2006/0098699 A1* | 5/2006 | Sanchez | 372/26 |

FOREIGN PATENT DOCUMENTS

| | | |
|---|---|---|
| EP | 0745868 B1 | 4/2002 |
| EP | 0913896 B1 | 2/2004 |
| EP | 02704344 | 10/2004 |
| EP | 04017254 | 10/2004 |
| EP | 1471671 A2 | 12/2004 |
| JP | 58140175 A | 8/1983 |
| JP | 62124576 A | 6/1987 |
| JP | 62235975 A | 10/1987 |
| JP | 62281485 A | 12/1987 |
| JP | 402102589 A | 4/1990 |
| JP | 404023373 A | 1/1992 |
| JP | 06209209 A | 7/1994 |
| JP | 09162811 A | 6/1997 |
| WO | WO 98/00893 | 1/1998 |
| WO | WO 98/00943 | 8/1998 |
| WO | PCT/US02/03226 | 5/2002 |
| WO | WO 02/063800 A1 | 8/2002 |
| WO | PCT/US04/11130 | 10/2004 |
| WO | WO/2004/098100 | 11/2004 |

OTHER PUBLICATIONS

Maeda, Noriyuki "Notification of Reason(s) for Refusal," Japanese Patent Application No. JP2002-563630, Nakamura, M. et al., Jul. 13, 2005.

Finisar Corp., "App. Note AN-2025: Using the Finisar GBIC I²C Test Diagnostics Port," 1998.

Hausdorf, Reiner, "Mobile Transceiver Measurements with Radiocommunication Service Monitor CMS," News from Rohde & Schwarz, 127, IV, 1989, pp. 4-7.

Webopedia: The 7 Layers of the OSI Model [online] [retrieved Oct. 15, 2003]. Retrieved from Internet: URL: http://webopedia.internet.com/quick_ref/OSI_Layers.asp.

Webopedia.com: Public-Key Encryption [online] [retrieved Oct. 15, 2003]. Retrieved from Internet: URL: http://www.webopedia.com/TERM/p/public_key_cryptography.html.

Webopedia.com: MAC Address [online] [retrieved Oct. 15, 2003]. Retrieved from Internet: URL: http://www.webopedia.com/TERM/M/MAC_address.html.

Webopedia.com: 12C [online] [retrieved Nov. 11, 2003]. Retrieved from Internet: URL: http://www.webopedia.com/TERM/I/12C.html.

Manchester Encoding [online] [retrieved Nov. 12, 2003]. Retrieved from Internet: URL: http://www.erg.abdn.ac.uk/users/gorry/course/phy-pages/man.html.

Documentation entitled "IR Receiver ASSP: T2525", copyright 2003 by Atmel Corporation.

Documentation entitled "IR Receiver for Data Communication: U2538B", copyright 2003 by Atmel Corporation.

Documentation entitled "Low-Voltage Highly Selective IR Receiver IC: T2527", copyright 2002 by Atmel Corporation.

Documentation entitled "Application Note: T2525/26/27", copyright 2003 by Atmel Corporation.

*LXT16706/16707 SerDes Chipset*, Intel Products, www.intel.com/design/network/products/optical/phys/lxt16706.htm, Apr. 19, 2002.

*LXT35401 XAU1-to-Quad 3.2G Transceiver*, Intel Products, www.intel.com/design/network/products/optical/phys/1xt35401.htm, Apr. 19, 2002.

Texas Instruments User's Guide, *TLK2201 Serdes EVM Kit Setup and Usage*, Mixed Signal DSP Solutions, Jul. 2000.

Texas Instruments User's Guide, *TLK1501 Serdes EVM Kit Setup and Usage*, Mixed Signal Products, Jun. 2000.

National Semiconductor DS92LV16 Design Guide, *Serializing Made Simple*, Feb. 2002.

Vaishali Semiconductor, *Fibre Channel Transceiver*, VN16117, MDSN-0002-02, Aug. 9, 2001.

Fairchild Semiconductor, Application Note 77, *CMOS, the Ideal Logic Family*, Jan. 1983.

Analog Target Specification, Annex 48B, Published by IEEE New York, May 2001, pp. 6-14.

*Optiport SFF BiDi-Transceiver 100 Mbit/s, 1310 nm Tx/1550 nm Rx*, Infineon Technologies, Jun. 22, 2004, pp. 1-14.

\* cited by examiner

CALIBRATION OF DIGITAL DIAGNOSTICS INFORMATION IN AN OPTICAL TRANSCEIVER PRIOR TO REPORTING TO HOST

CROSS-REFERENCE TO RELATED APPLICATIONS

This application claims the benefit of U.S. Provisional Application No. 60/585,254, filed Jul. 2, 2004, which is incorporated herein by reference in its entirety.

BACKGROUND OF THE INVENTION

1. The Field of the Invention

The present invention relates generally to optical transceivers and optical transceiver host computing systems (hereinafter referred to simply as "host"). More specifically, the present invention relates to calibrating digital diagnostic information of the optical transceiver prior to reporting the calibrated information to the host.

2. The Relevant Technology

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

Typically, data transmission in such networks is implemented by way of an optical transmitter (also referred to as an electro-optic transducer), such as a laser or Light Emitting Diode (LED). The electro-optic transducer emits light when current is passed there through, the intensity of the emitted light being a function of the current magnitude through the transducer. Data reception is generally implemented by way of an optical receiver (also referred to as an optoelectronic transducer), an example of which is a photodiode. The optoelectronic transducer receives light and generates a current, the magnitude of the generated current being a function of the intensity of the received light.

Various other components are also employed by the optical transceiver to aid in the control of the optical transmit and receive components, as well as the processing of various data and other signals. For example, such optical transceivers typically include an electro-optic transducer driver (e.g., referred to as a "laser driver" when used to drive a laser signal) configured to control the operation of the optical transmitter in response to various control inputs. The optical transceiver also generally includes an amplifier (e.g., often referred to as a "post-amplifier") configured to perform various operations with respect to certain parameters of a data signal received by the optical receiver. A controller circuit (hereinafter referred to the "controller") controls the operation of the laser driver and post amplifier.

Additionally, the controller may also include various sensors that are capable of measuring transceiver operational parameters. There may also be sensors coupled to the laser driver, the post-amplifier and other transceiver components. These operational parameters may include temperature, voltage to the transceiver, laser bias current, receive and transmit power, and the like.

During the operation of the optical transceiver, it is often useful to perform diagnostics of the various operational parameters. A typical way diagnostics are performed is to have the sensors measure an operational parameter value and send the value to an analog to digital converter, which may be within the controller or may be a separate transceiver component. The analog to digital converter converts the value to a digital signal and reports the value to a host computing system coupled to the transceiver module. This allows a user or the host to then evaluate the various operational parameters.

However, the digitally converted signals that are reported to the host often do not represent the actual measured analog values. This is due to some predictable signal corruption that is often inherent in the analog to digital conversion.

One way to alleviate these problems is to have the host perform calibration on the digital values it receives from the transceiver analog to digital converter. The transceiver manufacturer would provide the user with an equation for the digital output of an ideal analog to digital converter with no predictable error. The user would then be able to have the host use the equation to perform a calibration on the digitally converted signal. In this way, reliable digital diagnostics values can be obtained.

However, having the host perform the calibration on the digital diagnostics information uses valuable host resources that are necessary for other host operations. This may affect the overall speed and performance of the calibration operation. This is especially true for a host that supports multiple optical transceivers. In addition, having the host perform the calibration often requires a larger or faster host microprocessor or adding additional processors.

Therefore, what would be advantageous is an optical transceiver that is capable of performing calibration of digital diagnostics internally prior to reporting the diagnostic values to the host.

BRIEF SUMMARY OF THE INVENTION

The forgoing problems with the prior state of the art are overcome by the principles of the present invention, which relates to an optical transceiver configured to perform calibration of digital diagnostics prior to providing the calibrated values to a host computing system that is communicatively couplable to the optical transceiver. The optical transceiver includes a system memory, and at least one processor.

The optical transceiver measures analog operational parameter signals. These analog signals may include transceiver temperature, transceiver voltage, laser bias current, and receive and transmit power and the like. The optical transceiver then obtains digital samples from the analog signals. However, the digital samples may often contain predictable error from the analog-to-digital conversion or perhaps from other components the sense or process the analog signals prior to arriving at the analog-to-digital converter. To compensate for this predicable error, the optical transceiver performs calibration.

Specifically, microcode is loaded into the system memory. The microcode, when executed by the at least one processor, causes the optical transceiver to perform a calibration operation on the digitally converted samples to remove the predictable error. The execution of the microcode causes the optical transceiver to enforce calibration rules in order to perform the calibration. The transceiver may then make the calibrated results accessible to the host.

Accordingly, the principles of the present invention provide for calibration of digital diagnostic information prior to the transceiver making the digital diagnostics information accessible to the host. This saves valuable host computing resources for other host operations. In addition, many hosts are not able to access enough samples for reliable calibration. This may be due to slower communication channels between the host and transceiver. Since the optical transceiver is able to access the samples more quickly and efficient, and since the optical transceiver itself performs the calibration, the calibration likewise is much more efficient.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
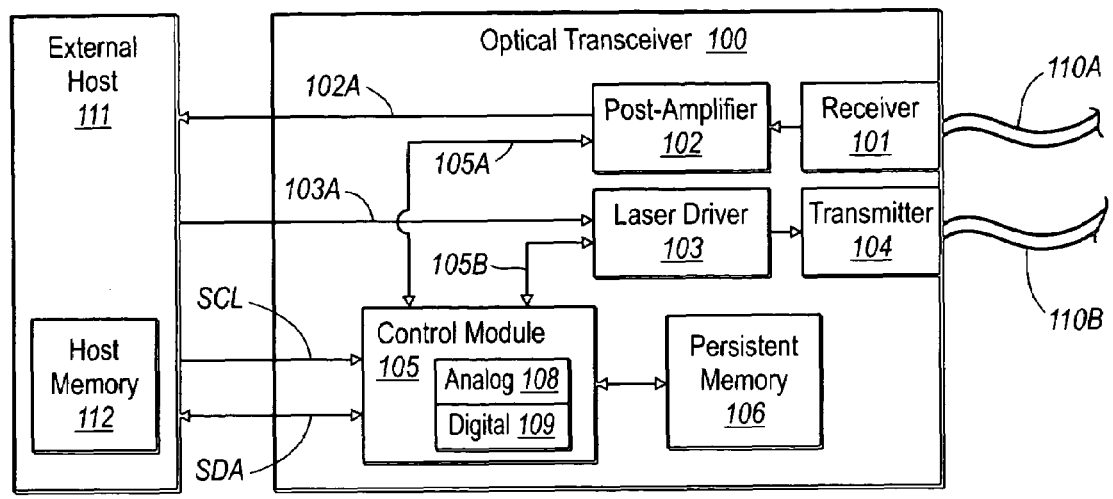
FIG. 1 schematically illustrates an example of an optical transceiver that may implement features of the present invention.

The principles of the present invention relate to an optical transceiver configured to perform calibration of digital diagnostics prior to providing the calibrated values to a host computing system (hereinafter referred to simply as a "host") that is communicatively coupled to the optical transceiver. The optical transceiver includes a sensor that measures an analog operational parameter signal such as temperature or supply voltage. Each analog signal is then converted to digital samples by analog to digital converter(s). A processor executes microcode that causes the optical transceiver to perform calibration on the various samples to compensate for predictable error introduced into the analog signal prior to or during the analog-to-digital conversion. The optical transceiver may then make the calibrated result accessible to the host. This may be accomplished by the host polling the transceiver for calibrated results and/or by the transceiver directly logging the calibrated results to the host. An example operational optical transceiver environment will first be described. Then, the operation in accordance with the invention will be described with respect to the operational environment FIG. 1 illustrates an optical transceiver 100 in which the principles of the present invention may be employed. While the optical transceiver 100 will be described in some detail, the optical transceiver 100 is described by way of illustration only, and not by way of restricting the scope of the invention. The principles of the present invention are suitable for 1 G, 2 G, 4 G, 8 G, 10 G and higher bandwidth fiber optic links. Furthermore, the principles of the present invention may be implemented in optical (e.g., laser) transmitter/receivers of any form factor such as XFP, SFP and SFF, without restriction. Having said this, the principles of the present invention are not limited to an optical transceiver environment at all.

The optical transceiver 100 receives an optical signal from fiber 110A using receiver 101. The receiver 101 acts as an opto-electric transducer by transforming the optical signal into an electrical signal. The receiver 101 provides the resulting electrical signal to a post-amplifier 102. The post-amplifier 102 amplifies the signal and provides the amplified signal to an external host 111 as represented by arrow 102A. The external host 111 may be any computing system capable of communicating with the optical transceiver 100. The external host 111 may contain a host memory 112 that may be a volatile or non-volatile memory source. In one embodiment, the optical transceiver 100 may be a printed circuit board or other components/chips within the host 111, although this is not required.

The optical transceiver 100 may also receive electrical signals from the host 111 for transmission onto the fiber 110B. Specifically, the laser driver 103 receives the electrical signal as represented by the arrow 103A, and drives the transmitter 104 (e.g., a laser or Light Emitting Diode (LED)) with signals that cause the transmitter 104 to emit onto the fiber 110B optical signals representative of the information in the electrical signal provided by the host 111. Accordingly, the transmitter 104 serves as an electro-optic transducer.

The behavior of the receiver 101, the post-amplifier 102, the laser driver 103, and the transmitter 104 may vary dynamically due to a number of factors. For example, temperature changes, power fluctuations, and feedback conditions may each affect the performance of these components. Accordingly, the optical transceiver 100 includes a control module 105, which may evaluate temperature and voltage conditions and other operational circumstances, and receive information from the post-amplifier 102 (as represented by arrow 105A) and from the laser driver 103 (as represented by arrow 105B). This allows the control module 105 to optimize the dynamically varying performance, and additionally detect when there is a loss of signal.

Specifically, the control module 105 may counteract these changes by adjusting settings on the post-amplifier 102 and/or the laser driver 103 as also represented by the arrows 105A and 105B. These settings adjustments are quite intermittent since they are only made when temperature or voltage or other low frequency changes so warrant. Receive power is an example of such a low frequency change.

The control module 105 may have access to a persistent memory 106, which in one embodiment, is an Electrically Erasable and Programmable Read Only Memory (EEPROM). The persistent memory 106 and the control module 105 may be packaged together in the same package or in different packages without restriction. Persistent memory 106 may also be any other non-volatile memory source.

Figure 2:
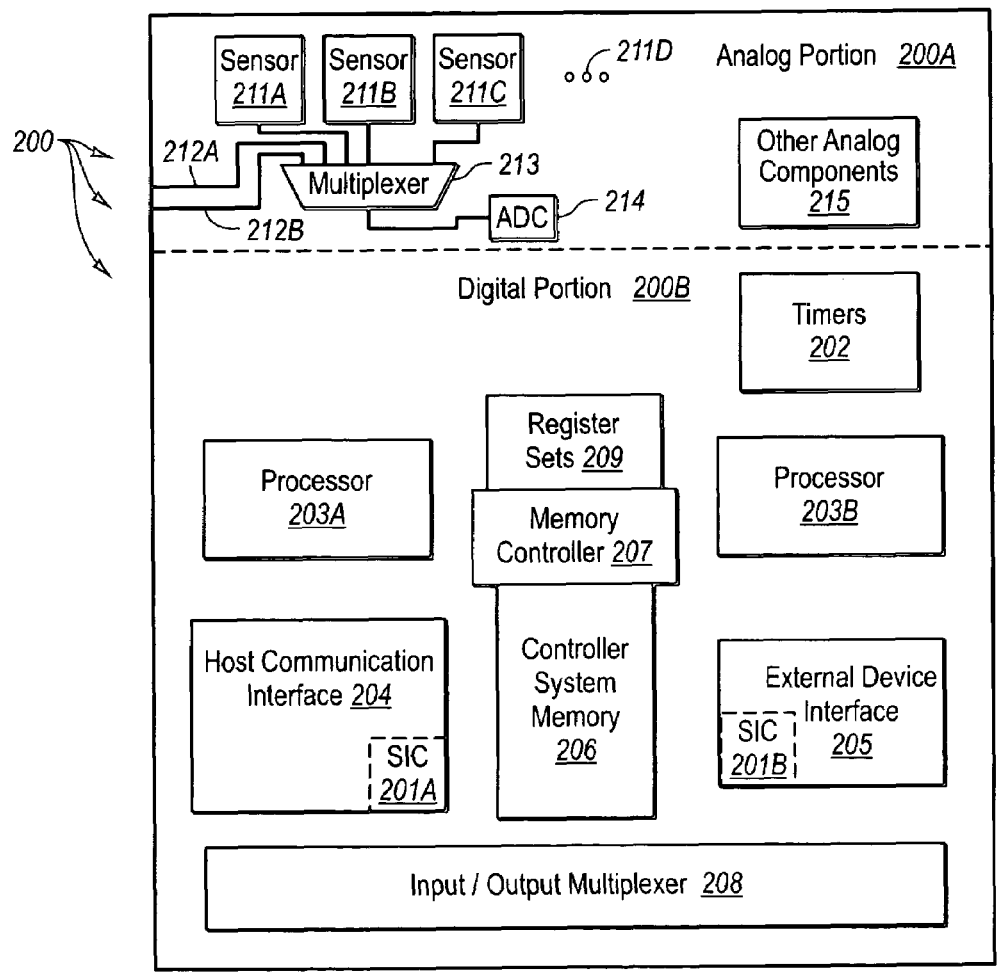
FIG. 2 schematically illustrates an example of a control module of FIG. 1.

The control module 105 includes both an analog portion 108 and a digital portion 109. Together, they allow the control module to implement logic digitally, while still largely interfacing with the rest of the optical transceiver 100 using analog signals. FIG. 2 schematically illustrates an example 200 of the control module 105 in further detail. The control module 200 includes an analog portion 200A that represents an example of the analog portion 108 of FIG. 1, and a digital portion 200B that represents an example of the digital portion 109 of FIG. 1.

For example, the analog portion 200A may contain digital to analog converters, analog to digital converters, high speed comparators (e.g., for event detection), voltage based reset generators, voltage regulators, voltage references, clock generator, and other analog components. For example, the analog portion 200A includes sensors 211A, 211B, 211C amongst potentially others as represented by the horizontal ellipses 211D. Each of these sensors may be responsible for measuring operational parameters that may be measured from the control module 200 such as, for example, supply voltage and transceiver temperature. The control module may also receive external analog or digital signals from other components within the optical transceiver that indicate other measured parameters such as, for example, laser bias current, transmit power, receive power, laser wavelength, laser temperature, and Thermo Electric Cooler (TEC) current. Two external lines 212A and 212B are illustrated for receiving such external analog signals although there may be many of such lines.

The internal sensors may generate analog signals that represent the measured values. In addition, the externally provided signals may also be analog signals. In this case, the analog signals are converted to digital signals so as to be available to the digital portion 200B of the control module 200 for further processing. Of course, each analog parameter value may have its own Analog to Digital Converter (ADC). However, to preserve chip space, each signal may be periodically sampled in a round robin fashion using a single ADC such as the illustrated ADC 214. In this case, each analog value may be provided to a multiplexer 213, which selects in a round robin fashion, one of the analog signals at a time for sampling by the ADC 214. Alternatively, multiplexer 213 may be programmed to allow any order of analog signals to be sampled by ADC 214.

As previously mentioned, the analog portion 200A of the control module 200 may also include other analog components 215 such as, for example, digital to analog converters, other analog to digital converters, high speed comparators (e.g., for event detection), voltage based reset generators, voltage regulators, voltage references, clock generator, and other analog components. The digital portion 200B of the control module 200 may include a timer module 202 that provides various timing signals used by the digital portion 200B. Such timing signals may include, for example, programmable processor clock signals. The timer module 202 may also act as a watchdog timer.

Two general-purpose processors 203A and 203B are also included. The processors recognize instructions that follow a particular instruction set, and may perform normal general-purpose operation such as shifting, branching, adding, subtracting, multiplying, dividing, Boolean operations, comparison operations, and the like. In one embodiment, the general-purpose processors 203A and 203B are each a 16-bit processor and may be identically structured. The precise structure of the instruction set is not important to the principles of the present invention as the instruction set may be optimized around a particular hardware environment, and as the precise hardware environment is not important to the principles of the present invention.

A host communications interface 204 is used to communicate with the host 111, possibly implemented using a two-wire interface such as I²C shown in FIG. 1 as the serial data (SDA) and serial clock (SCL) lines on the optical transceiver 100. Other host communication interfaces may also be implemented as well. Data may be provided from the control module 105 to the host 111 using this host communications interface to allow for digital diagnostics and readings of temperature levels, transmit/receiver power levels, and the like. The external device interface 205 is used to communicate with, for example, other modules within the optical transceiver 100 such as, for example, the post-amplifier 102, the laser driver 103, or the persistent memory 106.

The internal controller system memory 206 (not to be confused with the external persistent memory 106) may be Random Access Memory (RAM) or non-volatile memory. The memory controller 207 shares access to the controller system memory 206 amongst each of the processors 203A and 203B and with the host communication interface 204 and the external device interface 205. In one embodiment, the host communication interface 204 includes a serial interface controller 201A, and the external device interface 205 includes a serial interface controller 201B. The two serial interface controllers 201A and 201B may communicate using a two-wire interface such as I²C or may be another interface so long as the interface is recognized by both communicating modules. One serial interface controller (e.g., serial interface controller 201B) is a master component, while the other serial interface controller (e.g., serial interface controller 201A) is a slave component.

An input/output multiplexer 208 multiplexes the various input/output pins of the control module 200 to the various components within the control module 200. This enables different components to dynamically assign pins in accordance with the then-existing operational circumstances of the control module 200. Accordingly, there may be more input/output nodes within the control module 200 than there are pins available on the control module 200, thereby reducing the footprint of the control module 200.

Register sets 209 contain a number of individual registers. These registers may be used by the processors 203 to write microcode generated data that controls high speed comparison in optical transceiver 100. Alternatively, the registers may hold data selecting operational parameters for comparison. Additionally, the registers may be memory mapped to the various components of optical transceiver 100 for controlling aspects of the component such as laser bias current or transmit power.

Having described a specific environment with respect to FIGS. 1 and 2, it will be understood that this specific environment is only one of countless architectures in which the principles of the present invention may be employed. As previously stated, the principles of the present invention are not intended to be limited to any particular environment.

In accordance with the present invention, an optical transceiver performs calibration on various operational parameter signals. The operational parameters may be measured from various analog sensors in the optical transceiver. The optical transceiver converts each analog signal into digital samples and receives microcode into system memory that when executed by optical transceiver processors causes the optical transceiver to perform calibration on the digital samples. The optical transceiver may then make the calibrated results accessible to a host computing system (hereinafter referred to simply as a "host") that is communicatively couplable to the optical transceiver.

Figure 3:
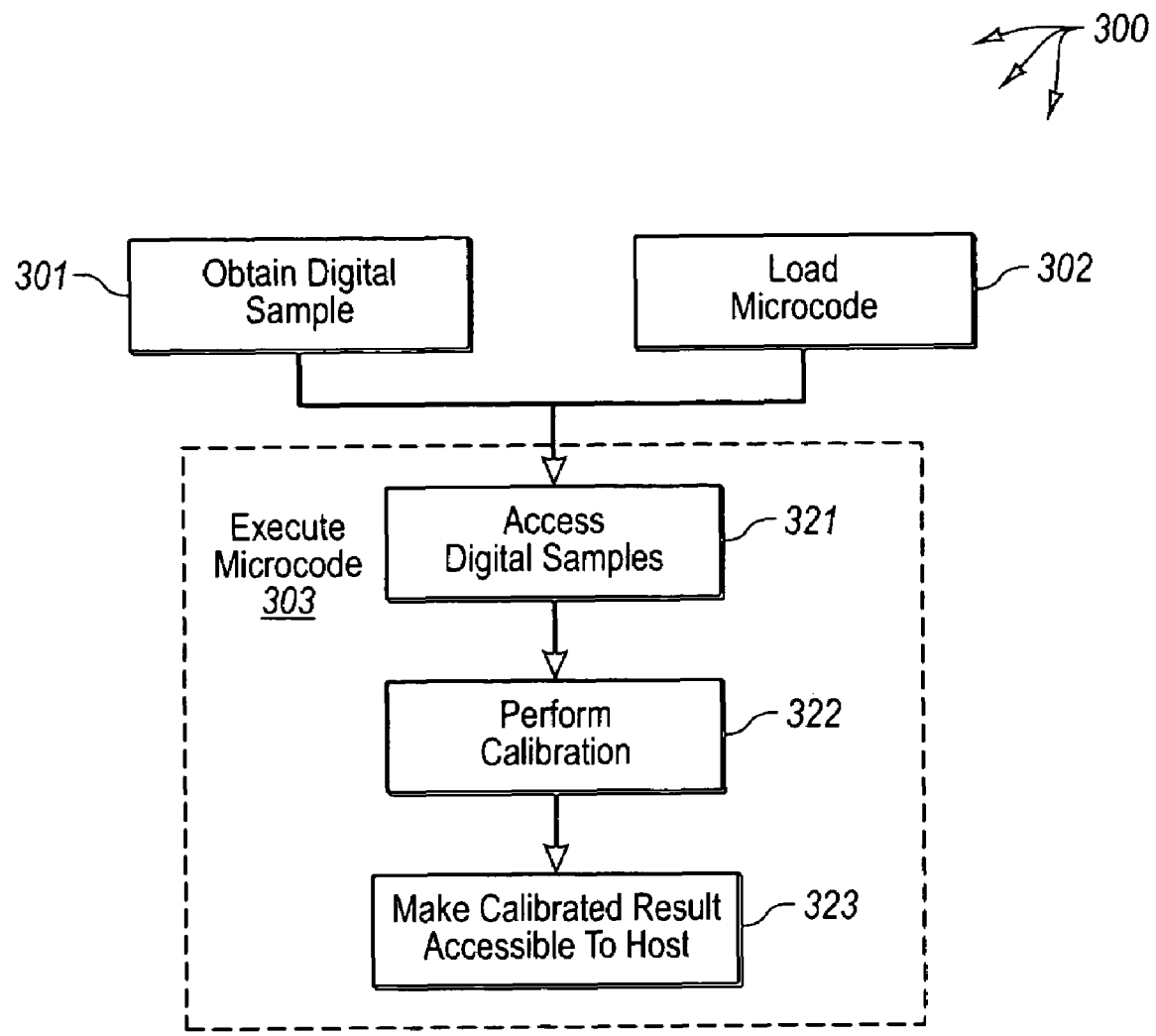
FIG. 3 illustrates a flowchart of a method for an optical transceiver to perform calibration of digital diagnostics prior to reporting the result to a host computing system in accordance with the principles of the present invention.

Referring to FIG. 3, a flowchart of a method 300 for an optical transceiver to perform calibration of digital diagnostics prior to reporting the results to the host is illustrated. The optical transceiver may first obtain a plurality of digital samples from an analog signal representing digital diagnostics information (act 301). This may be accomplished by having an optical transceiver analog sensor measure an analog signal. The sensor may provide the analog signal to an analog to digital converter for sampling to generate digital samples.

The optical transceiver loads microcode from various sources into the system memory (act 302). The microcode may be loaded from an optical transceiver persistent memory, the host, or a remote computing system that is coupled to the host or the optical transceiver over a network such as the internet. The microcode may also be loaded from any other source that is capable of providing microcode to the optical transceiver. As can be seen in FIG. 3, the order in which the optical transceiver performs acts 301 and 302 is unimportant to the principles of the present invention. The acts may occur in parallel, or either act 301 or 302 may occur first The processor(s) then execute the microcode (act 303). The microcode is structured such, when executed by the processor (s) of the optical transceiver, the optical transceiver performs the acts illustrated within act 303. Specifically, the optical transceiver accesses the digital samples (act 321), performs a calibration operation on the digital samples (act 322), and then optionally may make the calibrated digital result accessible to the host (act 323).

A particular embodiment will now be described with reference to the environment described and illustrated with respect to FIGS. 1 and 2. Referring to FIG. 1, transceiver 100 is shown as being communicatively couplable to host 111. In this description and in the claims, two entities are "communicatively couplable" if they are capable of being communicatively coupled with each other. In this description and in the claims, "communicatively coupled" is defined as being capable of communicating data either one way or bi-directionally.

Referring to FIG. 2, analog sensors 211A, 211B, and 211C are shown. In this description, "analog sensor" is defined as any device capable of making an analog measurement and generating a corresponding analog signal. As previously mentioned, analog sensors 211A, 211B, and 211C may be configured to measure various analog operational parameters of optical transceiver 100 such as transceiver temperature and supply voltage. These analog sensors generate an analog signal corresponding to a measured parameter value and send the signals to multiplexer 213. For example, if sensor 211A were configured to measure temperature, then it would send an analog signal corresponding to the measured temperature to multiplexer 213.

It may also be desirable to measure analog operational parameters that are external to control module 105. These may include laser bias current, transmit power, receive power, and the like. Analog sensors may be coupled with post-amplifier 102 and laser driver 103 to ensure measurement of desired operational parameters. For. example, an analog sensor coupled to the laser driver 103 may measure the laser bias current or other laser operational parameters. Analog sensors may also be coupled to any component of optical transceiver 100 to obtain desired measurements. The external measured results are sent to multiplexer 213 through use of external connection lines 212A and 212B.

The measured analog signals are sent to ADC 214 for conversion to digital samples. However, the samples that are output from ADC 214 may contain predictable error. The predictable error in the digital samples may be caused by many factors. For example, in many instances predictable error is introduced during the analog-to-digital conversion. This is perhaps the most common type of predictable error. Predictable error may also be created by environmental influences such as changing temperature of fluctuating power supply. In addition, there may be predictable error introduced in the analog signal before the signal undergoes an analog-to-digital conversion. For example, when the optical transceiver is operating near the limit of a sensor's operational range, the measured result may include predictable error. In addition, there may be intervening circuitry between the sensor and ADC 214 that may also introduce the predictable error as the signal is propagated through the circuitry.

For instance, for sensors located outside of control module 105 in particular, there may be attenuation as the signal propagates down lines 212A and 212B. In some cases, the predictable error may be caused by a combination of all or a subset of these factors. Furthermore, the ability of a sensor to sense may deteriorate as temperature and power supply fluctuates. The sensor may also introduce predictable error according to the age of the sensor. The predictable error, regardless of the cause, must be calibrated out in order for optical transceiver to make current results available to the host.

Calibration, according to the principles of the present invention, is accomplished by taking digital values from the ADC 214 and inputting the values into a calibration operation. In the description and in the claims, "calibration" is defined to mean the conversion (or mapping) of input digital values to output digital values using predictable rules that depend at least on the value of the input digital value, and may depend on other dynamically changing factors such as, for example, temperature, optical receive power, power supply, or the like. For example, digital values from the ADC are subjected to such calibration. These sets of predictable rules may be contained in the microcode executed by the processors and may be a mathematical equation, a mathematical function, a relationship between ranges of values such as a table of values to a single value, or the like.

The calibration following the set of predictable rules converts the input digital values to a corresponding set of output digital values that no longer includes the predictable error. In many cases, the predictable rules are not static, but also include dynamic factors that must be constantly provided for. For example, a calibration equation may change with a corresponding change in temperature, and requires a constant reading of the current temperature. As long as the error introduced into the digital values is at last partially predictable, a set of predictable rules may be devised for a calibration operation to be performed that will remove the predictable error.

The calibration in accordance with the present invention may also be used to present the calibrated results in a form more acceptable to the interpreter of the results, even if there is no predictable error to calibrate out of the values. For example, the digital values from the ADC may be in a linear form, while it is desirable to view the values in a non-linear form, such as logarithmic for power measurements. The linear values may be converted into the corresponding non-linear values by a calibration operation, which may then be made accessible to the host.

Figure 4:
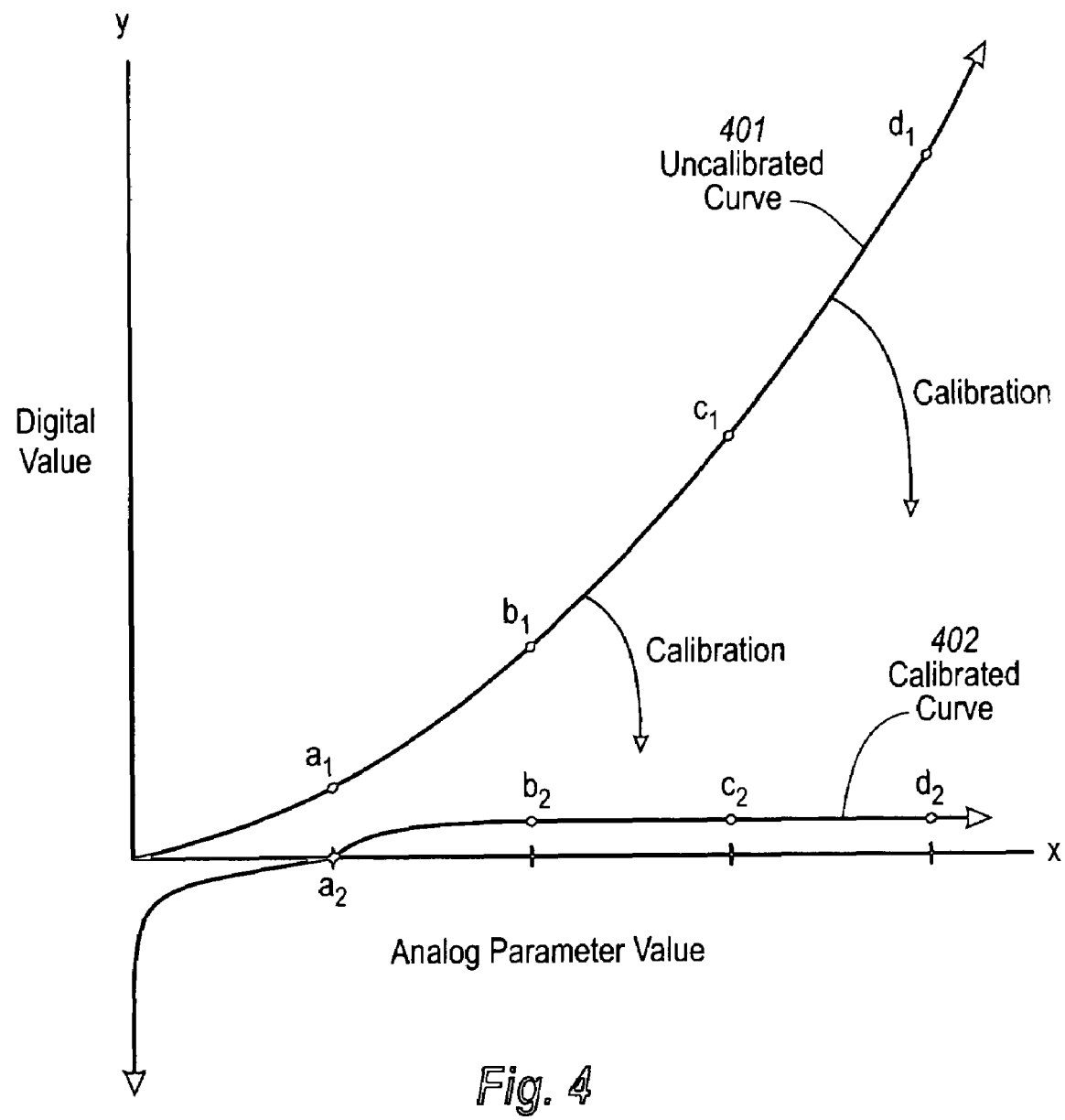
FIG. 4 illustrates a plot of an uncalibrated, non-linear curve and a plot of a calibrated, non-linear curve.

Referring to FIG. 4, an example of a calibration using the principles of the present invention is shown. FIG. 4 shows an analog parameter value on the horizontal (x) axis versus a corresponding digital value on the vertical (y) axis. Line 401 represents an uncalibrated (i.e., containing predictable error) non-linear output curve from the analog to digital converter 214. In the example shown, the samples from the ADC generally comport to an $X^2$ function. This is by way of example only. The output may be in the form of any type of function, whether it be linear, non-linear, or some range or relationship of values such as a table of values. Line 402, on the other hand, represents a calibrated curve that has undergone a calibration operation to remove the predictable error. In this case, the values that have undergone calibration generally comport to a $\log_{10}$ of the square root of X function.

As mentioned above, processors 203A and 203B are general purpose processors capable of performing general-purpose operations necessary to perform a calibration. Processors 203A and 203B read the microcode from controller system memory 206. In this example, the microcode contains a calibration function that converts the samples from the ADC that generally comport to an $X^2$ function into values that generally comport to the $\log_{10}$ of the square root of X function. The microcode is loaded from persistent 106 into controller system memory 206, where the processors 203 execute this microcode instruction and begin the calibration operation. Referring to FIG. 4, the processors take the square root of point a1 and then take the $\log_{10}$. This produces point a2. The process is repeated for points b1, c1, and d1 to produce points b2, c2, and d2 respectively. The points a2, b2, c2, and d2 will no longer contain predictable error, or will only contain an acceptable amount of predictable error, and have been mapped onto the calibrated line. The points a2, b2, c2, and d2 represent an ideal (or close to ideal) relationship between a measured analog parameter value and a digital value with no predictable error. This example shows that an uncalibrated, non-linear output of ADC may be mapped into a non-linear, calibrated result. This is especially useful for parameters such as power that are commonly represented by logarithmic functions.

The principles of the present invention work equally as well, as mentioned previously, for other types of input and output relationships. For example, the output samples from ADC 214 may comport to an uncalibrated, linear function that is mapped into a calibrated, non-linear result. Alternatively, the output from ADC 214 may comport to a non-linear function that is mapped onto a calibrated linear result. Perhaps the most common relationship is for samples that comport to a linear output from ADC 214 to be mapped into a calibrated linear output by doing a slope and offset adjustment. As this is so common, this relationship will now be described.

Figure 5:
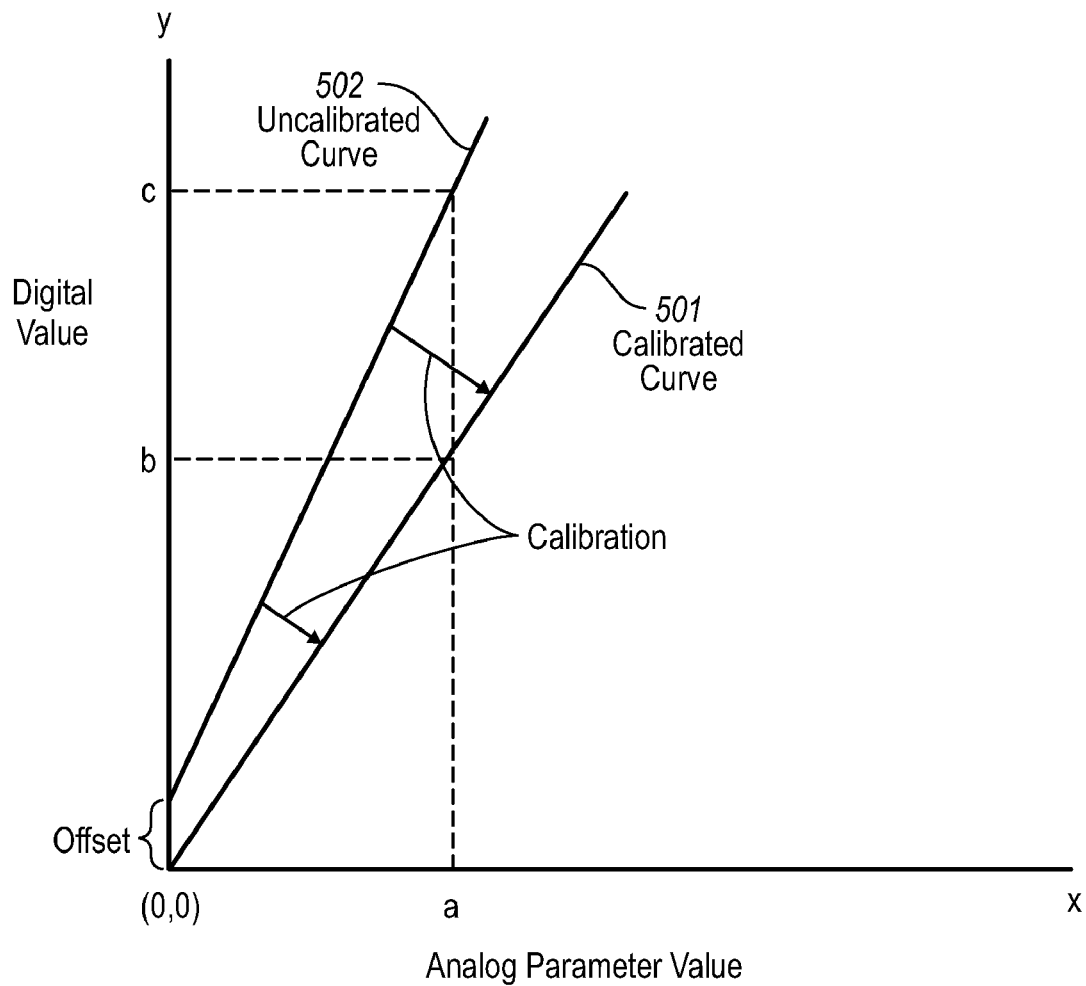
FIG. 5 illustrates a plot of an uncalibrated, linear curve and a plot of a calibrated, linear curve.

Referring to FIG. 5, an analog parameter value on the horizontal (x) axis versus a corresponding digital value on the vertical (y) axis is shown as in FIG. 4. Line 501 represents a calibrated relation between the analog parameter value and the digital output . . . However, line 502 shows an uncalibrated result from the ADC due to predictable error created by the analog to digital conversion. Note that the line 502 has a certain offset with respect to the calibrated line 501. Furthermore, note that the line 502 has a different slope as compared to the line 501.

In order to remove the offset, a least square curve is calculated by the processors 203 based on the digital samples obtained from the analog to digital converter 214 and stored in register sets 209. It is then determined where this curve intersects with the vertical axis of FIG. 5. Then, the processors 203 determine the offset between the actual intersection point of line 502 and the desired intersection point of line 501, which is usually (0,0). Any digital value that is taken from the analog to digital converter is then adjusted by this offset. This has the effect to shift line 502 downwards by the amount of the offset to thereby cancel the offset.

In order to correct the slope of the shifted line 502, a multiplier is then determined. This multiplier is the reciprocal of the slope of the ideal line 501 divided by the slope of the measured line 502. For example, in FIG. 5, the slope of the line 501 is b/a, whereas the slope of line 502 is (c-offset)/a. Therefore, the multiplier is b/(c-offset). Any digital value that is taken from the analog to digital converter is multiplied by this multiplier after having been subjected to the offset adjustment described above. This has the effect of making the shifted line 502 substantially congruent with line 501. Therefore, the adjusted values would closely conform to the desired value given the analog value.

Microprocessors 203A and 203B receive, as previously discussed, microcode from persistent memory 106. In addition to directing processors 203 to perform the calibration operation, this microcode may also direct processors 203 to make the calibrated results accessible to the host 111. This may be accomplished by the host polling the transceiver for the filtered results and/or by the transceiver directly logging the filtered results to the host. Making the calibrated results accessible to the host allows for easy monitoring of the operational parameters by a user. It also allows the host 111 to use the calibrated data in other user defined operations.

Accordingly, the principles of the present invention provide for an optical transceiver that calibrates digital diagnostics information prior to communicating with the host computer system. The digital diagnostics information is calibrated by removing known offset values that are created by the digital to analog conversion. This produces a result that conforms to required standards. Accordingly, the digital diagnostics information is highly accurate as provided directly out of the optical transceiver. No further calibration is needed on the host, thereby preserving processing resources of the host, and allowing for accurate digital diagnostic information to be quickly available. Accordingly, the principles of the present invention represent a significant advancement in the art of optical transceivers The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. In an optical transceiver that is communicatively couplable to a host computing system, the optical transceiver including at least one analog to digital converter, a system memory, and at least one processor, a method for the optical transceiver to perform calibration of digital diagnostics information prior to communicating with the host computing system, the method comprising the following:

an act of obtaining digital samples from an analog signal, wherein the digital samples include predictable error introduced by operation of the optical transceiver;

an act of executing microcode using the at least one processor, the microcode including one or more predefined rules configured to at least partially remove the predictable error from the digital samples, to thereby cause the optical transceiver to perform the following:

an act of calibrating the digital samples such that the predictable error is at least partially removed from the digital samples using the one or more predefined rules.

2. A method in accordance with claim 1, further comprising:

an act of making the calibrated digital samples accessible to the host computing system.

3. A method in accordance with claim 1, wherein the digital samples generally conform to a first non-linear function, and wherein the act of calibrating the digital samples comprises:

an act of mapping the digital samples to generate calibrated digital samples that generally conform to a second non-linear function that is different from the first non-linear function.

4. A method in accordance with claim 1, wherein the digital samples generally conform to a non-linear function, and wherein the act of calibrating the digital samples comprises:
an act of mapping the digital samples to generate calibrated digital samples that generally conform to a linear function.

5. A method in accordance with claim 1, wherein the digital samples generally conform to a linear function, and wherein the act of calibrating the digital samples comprises:
an act of mapping the digital samples to generate calibrated digital samples that generally conform to a non-linear function.

6. A method in accordance with claim 1, wherein the digital samples generally conform to a first linear function, and wherein the act of calibrating the digital samples comprises:
an act of mapping the digital samples to generate calibrated digital samples that generally conform to a second linear function that is different from the first linear function.

7. A method in accordance with claim 1, wherein the analog signal is one of transceiver temperature, transceiver supply voltage, laser bias current, transceiver receive power, or transceiver transmit power.

8. A method in accordance with claim 1, wherein the predictable error is introduced during analog to digital conversion, during changes in environmental conditions, or during changes in operational conditions.

9. A method in accordance with claim 1, wherein the optical transceiver includes a controller that is at least indirectly coupled to both the optical transmitter and the optical receiver.

10. An optical transceiver comprising the following:
at least one processor;
an analog to digital converter configured obtain a plurality of digital samples from an analog signal, wherein the digital samples include predictable error introduced by operation of the optical transceiver; and
a system memory having microcode thereon, the microcode including one or more predefined rules configured to at least partially remove the predictable error from the digital samples, wherein the microcode is structured such that, when executed by the at least one processor, the optical transceiver is caused to access the digital samples and perform a calibration operation on the digital samples such that the predictable error is at least partially removed from the digital samples using the one or more predefined rules.

11. An optical transceiver in accordance with claim 10, the calibrated result is made accessible to a host computing system coupled to the optical transceiver.

12. An optical transceiver in accordance with claim 10, wherein the digital samples generally conform to a first non-linear function, and wherein performing the calibration operation comprises mapping the digital samples to generate calibrated digital samples that generally conform to a second non-linear function that is different from the first non-linear function.

13. An optical transceiver in accordance with claim 10, wherein the digital samples generally conform to a non-linear function, and wherein performing the calibration operation comprises of mapping the digital samples to generate calibrated digital samples that generally conform to a linear function.

14. An optical transceiver in accordance with claim 10, wherein the digital samples generally conform to a linear function, and wherein performing the calibration operation comprises of mapping the digital samples to generate calibrated digital samples that generally conform to a non-linear function.

15. An optical transceiver in accordance with claim 10, wherein the digital samples generally conform to a first linear function, and wherein performing the calibration operation comprises mapping the digital samples to generate calibrated digital samples that generally conform to a second linear function that is different from the first linear function.

16. An optical transceiver in accordance with claim 10, wherein the analog signal is one of transceiver temperature, transceiver supply voltage, laser bias current, transceiver receive power, or transceiver transmit power.

17. An optical transceiver in accordance with claim 10, wherein the optical transceiver is one of a 1 G laser transceiver, a 2 G laser transceiver, a 4 G laser transceiver, a 8 G transceiver, or a 10 G laser transceiver.

18. An optical transceiver in accordance with claim 10, wherein the optical transceiver is a laser transceiver suitable for fiber optic links greater than 10 G.

19. An optical transceiver in accordance with claim 10, wherein the optical transceiver is one of a XFP laser transceiver, a SFP laser transceiver, or a SFF laser transceiver.

20. An optical transceiver in accordance with claim 10, wherein the optical transceiver includes a controller that is at least indirectly coupled to both the optical transmitter and the optical receiver.

* * * * *